US008490037B2

(12) United States Patent
Chen et al.

(10) Patent No.: US 8,490,037 B2
(45) Date of Patent: Jul. 16, 2013

(54) METHOD AND APPARATUS FOR TRACKING UNCERTAIN SIGNALS

(75) Inventors: Liang Chen, Shanghai (CN); Yufei Li, Shanghai (CN); Yong Feng Pan, Shanghai (CN); Jian Yang, Shanghai (CN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/280,853

(22) Filed: Oct. 25, 2011

(65) Prior Publication Data

US 2012/0110526 A1  May 3, 2012

(51) Int. Cl.
*G06F 17/50* (2006.01)

(52) U.S. Cl.
CPC ........ *G06F 17/5027* (2013.01); *G06F 17/5081* (2013.01)
USPC .............. 716/106; 716/111; 716/136; 703/16

(58) Field of Classification Search
CPC .......................... G06F 17/5022; G06F 17/5081
USPC ............................. 716/106, 111, 136; 703/16
See application file for complete search history.

(56) References Cited

U.S. PATENT DOCUMENTS

| 6,415,430 B1 * | 7/2002 | Ashar et al. ................... 716/105 |
| 6,536,019 B1 * | 3/2003 | Ouyang ........................ 716/136 |
| 6,591,402 B1 * | 7/2003 | Chandra et al. ............... 716/106 |
| 6,810,507 B2 | 10/2004 | Biswal et al. |
| 7,146,583 B1 * | 12/2006 | Sun et al. ...................... 716/113 |
| 7,224,689 B2 * | 5/2007 | Freeman ....................... 370/389 |
| 7,543,266 B2 * | 6/2009 | Brown, Jr. ..................... 716/101 |
| 7,565,636 B2 | 7/2009 | Hoppe |
| 7,742,907 B2 * | 6/2010 | Gupta et al. .................... 703/14 |
| 2002/0178427 A1 * | 11/2002 | Ding et al. ..................... 716/12 |
| 2003/0009554 A1 * | 1/2003 | Burch et al. .................. 709/224 |
| 2004/0122644 A1 * | 6/2004 | Neifert et al. .................. 703/16 |
| 2005/0278714 A1 * | 12/2005 | Vahid et al. ................... 717/159 |
| 2007/0088717 A1 * | 4/2007 | Chen ............................. 707/100 |
| 2008/0072182 A1 * | 3/2008 | He et al. ........................ 716/2 |

(Continued)

OTHER PUBLICATIONS

L. G. Jones, "Fast Batch and Incremental Netlist Compilation of Hierarchical Schematics", IEEE Transaction on Computer-Aided Design, vol. 10, No. 7, Jul. 1991, pp . 922-931.

(Continued)

*Primary Examiner* — Phallaka Kik
(74) *Attorney, Agent, or Firm* — Schmeiser, Olsen & Watts; Richard Kotulak

(57) ABSTRACT

A method and an apparatus for tracking uncertain signals in the simulation of chip design are provided. The method comprises: generating a directed graph which contains sequential logic devices and IO devices from the netlist of chip design, wherein the directed graph illustrates the signal association among the sequential logic devices and IO devices; obtaining the signals related with the sequential logic devices and IO devices from the simulation results, wherein the signals contain a plurality of uncertain signals; and back tracing at least a part of the plurality of uncertain signals along the directed graph to determine the device which firstly generates an uncertain signal. The corresponding apparatus is also provided. With the above method and apparatus, uncertain signals can be traced and their source can be determined, which improves the debugging efficiency.

20 Claims, 3 Drawing Sheets

U.S. PATENT DOCUMENTS

| | | | |
|---|---|---|---|
| 2008/0115099 A1* | 5/2008 | Patra | 716/13 |
| 2008/0209383 A1* | 8/2008 | Mayer | 716/13 |
| 2008/0301657 A1* | 12/2008 | Bowler et al. | 717/158 |
| 2009/0132981 A1* | 5/2009 | Alpert et al. | 716/6 |
| 2009/0271748 A1 | 10/2009 | Maturana et al. | |
| 2009/0313000 A1 | 12/2009 | Gloekler et al. | |
| 2010/0083199 A1 | 4/2010 | Wohl et al. | |
| 2010/0332514 A1* | 12/2010 | Steele et al. | 707/769 |
| 2011/0055792 A1* | 3/2011 | Pandey et al. | 716/131 |
| 2012/0047478 A1* | 2/2012 | Ge et al. | 716/108 |
| 2012/0110528 A1* | 5/2012 | Newcomb | 716/106 |
| 2012/0272199 A1* | 10/2012 | Pandey et al. | 716/112 |

OTHER PUBLICATIONS

J. Marantz, "Enhanced Visibility and Performance in Functional Verification by Reconstruction", DAC 98, Jun. 15-19, 1998, pp. 164-169.

R. Ranjan, et al., "Formal Verification Unleashed!", Jasper-da.com/newsevents/XPropagation_Contributed_Article, Sep. 25, 2011, 4 pages.

S. Tiwary, et al., "First Steps Towards SAT-based Formal Analog Verification", ICCAD '09. Nov. 2-5. 2009, pp. 1-8.

P. Wilcox, et al., "F/Logic—An Interactive Fault and Logic Simulator for Digital Circuits", Bell-Northern Research, pp. 68-73.

* cited by examiner

METHOD AND APPARATUS FOR TRACKING UNCERTAIN SIGNALS

TECHNICAL FIELD

This invention relates to the chip design field, more particularly, relates to a method and an apparatus for tracking uncertain signals in the simulation of chip design.

DESCRIPTION OF THE RELATED ART

Simulation is an indispensable step in the field of chip design. Usually, designers use EDA tools to simulate the designed chip logic and record the output values of each logic unit in every simulation cycle. The logic units can be nets, logic gates, registers, etc. The recorded output values of those logic units can be used later to debug the chip design. Generally, simulation tools store the output signals from said logic units in waveform files in clock sequence.

Usually, when the chip structure is not complex or the chip logic is only described in abstract, the waveform files generated by simulation tools are not too large and the chip debugging is relatively simple. However, as chip functions become stronger and stronger, the chip design is more and more complex, which makes the waveform files generated during the simulation very large, usually occupying multi-Giga space. Moreover, more and more design needs netlist simulation. Netlist simulation is a stage of chip functional verification, which can expose the timing problem in chip design. In this stage, the chip design is implemented as a netlist, which describes the connectivity between components. Simulation tools perform simulating test based on such netlist and record the output signal from each component and unit. Since there may exist problems in the layout of some units in chip design phase, these units may generate X signals which are different from the regular logic high (1) output and logic low (0) output, that's, uncertain signals between logic high and logic low. Once an X signal is outputted from a certain unit in the chip circuit, all subsequent units related to the above output will generate X signals. Thus, there are usually thousands or even tens of thousands of X signals in the simulation results.

The existing simulation tools start and/or stop simulation according to the check points set by designers, neither tagging the units which generate X signals nor stopping simulation when X signals are generated. Therefore, after obtaining the simulation results with numerous X signals, designers can't exactly know the root of these X signals. They can only select a part of X signals according to experiences, and then check and debug these signals manually. During this process, designers need to analyze the generated waveform files. However, as described above, the waveform files are huge if a chip is complex, and operations on such files will bring a long-time delay because of the huge size of the files. On the other hand, too many X signals makes designers have to analyze numerous signal waveforms, which further decreases the efficiency of analyzing waveform files. So, in order to debug chips, designers usually need to spend a lot of time to analyze the large waveform files and track numerous X signals, which is tedious and low-efficient. Therefore, the current chip debugging manner needs improvement to increase the efficiency of chip design and simulation.

SUMMARY OF THE INVENTION

In view of the above problems, this invention is provided to improve the current chip debug efficiency.

Specifically, according to one aspect of the invention, a method for tracking uncertain signals in the simulation of chip design is provided, comprising: generating a directed graph which contains sequential logic devices and IO devices from the netlist of chip design, wherein said directed graph illustrates the signal association among said sequential logic devices and IO devices; obtaining the signals related with said sequential logic devices and IO devices from the simulation results, wherein said signals contain a plurality of uncertain signals; and back tracing at least a part of said plurality of uncertain signals along said directed graph to determine the device which firstly generates an uncertain signal.

According to another aspect of the invention, an apparatus for tracking uncertain signals in the simulation of chip design is provided, comprising: a netlist analyzing unit, configured to generate a directed graph which contains sequential logic devices and IO devices from the netlist of chip design, wherein said directed graph illustrates the signal association among said sequential logic devices and IO devices; a result obtaining unit, configured to obtain the signals related with said sequential logic devices and IO devices from the simulation results, wherein said signals contain a plurality of uncertain signals; and a signal tracing unit, configured to back trace at least a part of said plurality of uncertain signals along said directed graph to determine the device which firstly generates an uncertain signal.

With the method and apparatus of this invention, X signals generated in chip circuit can be traced with high efficiency, and therefore the chip debugging efficiency is improved.

DETAILED DESCRIPTION OF THE PREFERRED EMBODIMENT

The following is the description of the embodiments in connection with the drawings. It is understood that the following described exemplary embodiments are intended to be illustrative, rather than restrictive, of the present invention.

Figure 1:
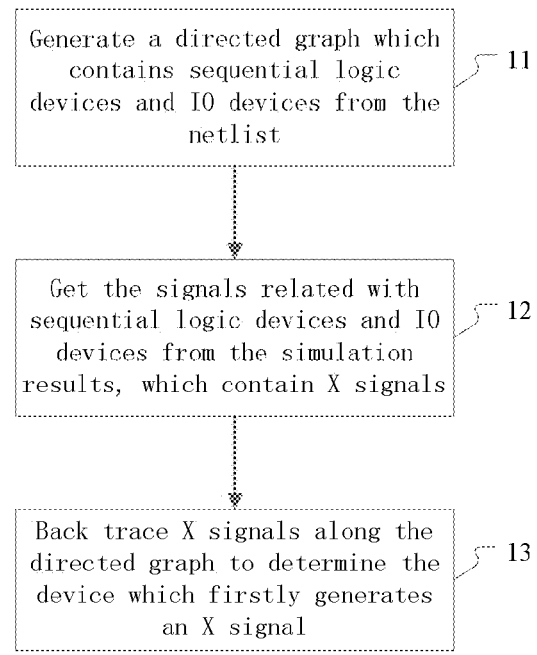
FIG. 1 is a flowchart of the method for tracking X signals according to one embodiment of the invention.

FIG. 1 is a flowchart of the method for tracking X signals according to one embodiment of the invention. As shown in FIG. 1, the method comprises: step 11 of generating a directed graph which contains sequential logic devices and IO devices from a netlist to illustrate the signal association of the devices; step 12 of obtaining signals related with the sequential logic devices and IO devices from the simulation results, wherein the signals contain a plurality of X signals; and step 13 of back tracing at least a part of the plurality of X signals along the directed graph to determine the device which firstly generates an X signal.

Specifically, the netlist is firstly analyzed at step 11. Generally, a netlist describes the connectivity between components in a chip circuit. These components include combinational logic devices, sequential logic devices and other devices. Combinational logic devices may have multiple inputs and outputs, wherein each output is the logical function of the corresponding input, and the output at any time only depends on the input at that time, not related with the previous inputs or outputs. Examples of combinational logic devices include various logical gates. Unlike combinational logic devices, for a sequential logic device, the output is dependent not only on the present input, but also on the previous state of the device. That's, sequential logic devices can keep and record the previous state in accordance with clock cycles, and thus possess a memory ability which combinational logic devices don't have. Examples of sequential logic devices include registers, counters, etc. Besides, the chip circuit and the corresponding netlist further include IO devices, which are configured to input and output signal from/to outside.

The research on X signals shows that combinational logic devices usually don't generate X signals. Therefore, it only needs to focus on sequential logic devices and IO devices when tracking X signals. Accordingly at step 11, the netlist is analyzed to distinguish combinational logic devices and sequential logic devices, so as to generate the directed graph which illustrates the signal association among sequential logic devices and IO devices contained in the circuit, while the information about combinational logic devices is ignored.

To distinguish sequential logic devices, combinational logic devices and IO devices, sequential logic device list, combinational logic device list and IO device list can be constructed. When going through the netlist for devices, it can be judged whether each device is a sequential logic device, a combinational logic device or an IO device by comparing it with the corresponding device list. In another embodiment, sequential logic devices, combinational logic devices and IO devices can be distinguished by referring to the device attributes recorded in the device lib. In yet another embodiment, when traversing the netlist, it distinguishes the devices according to the device connectivity. For example, in a netlist, a device connected with clock signals can be seen as a sequential logic device, a device without a clock signal can be seen as a combinational logic device, and a device directly connected with the outside input and output signals is an IO device.

After sequential logic devices, combinational logic devices and IO devices are distinguished, the directed graph with combinational logic devices excluded can be generated. There are already tools in the existing techniques, e.g. Design Compiler from Synopsys or Bulldozer from IBM, which can be used to generate the directed graph from the netlist. When the above tools are used to generate the directed graph, in one embodiment, only the information about sequential logic devices and IO devices is extracted from the netlist, based on which the directed graph is generated by existing tools. In another embodiment, the directed graph is directly generated from the netlist using the existing tools, and then combinational logic devices are removed from the directed graph to get the expected directed graph.

As for the format and generating process of the directed graph, in one embodiment, sequential logic devices and IO devices are taken as nodes and the nodes are connected along the direction of the output signal of each device in the netlist, so as to form the above directed graph.

In a specific example, when forming the directed graph, sequential logic devices are taken as one kind of nodes and IO devices are taken as another kind of nodes, so as to directly and visually illustrate each kind of devices.

Figure 2:
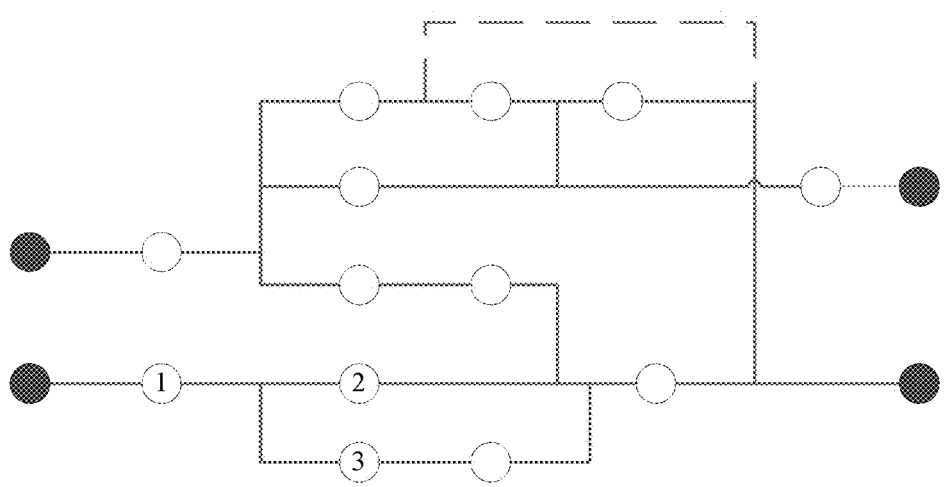
FIG. 2 illustrates an exemplary directed graph.

FIG. 2 illustrates an exemplary directed graph. In the directed graph, hollow circles represent one kind of nodes, that's sequential logic devices, and solid circles represent another kind of nodes, that's IO devices. As the input and output devices of the whole circuit, IO devices generally appear on the edge of the directed graph. According to the signal flow direction between devices in the netlist, the nodes are connected to illustrate the signal association among the devices. For example, in an exemplary case, a combinational logic device in the chip circuit takes the output from sequential logic device 1 (node 1 in FIG. 2) as the control signal, performs an operation on the input signal and records the generated output signal in sequential logic device 2 (node 2). In the directed graph with combinational logic devices ignored, sequential logic device 1 is illustrated as directly connecting with sequential logic device 2. That's, in the directed graph, node 1 connecting with node 2 means that the output signal from node 1 directly impacts the output of node 2, and there is signal association between node 1 and node 2. But physically, node 1 and node 2 are not necessarily directly connected, and combinational logic devices may exist between them. Besides, some chip design may include feedback loops, in which signals are feedback and circulated. Accordingly, the directed graph generated based on the netlist may also contain the corresponding feedback loops, shown as the dashed lines in FIG. 2. In order to keep the unidirectional attribute of the directed graph so as to facilitate the tracing of X signals, such feedback loops are cut off when the directed graph is generated.

It is understood that the format of the directed graph is not restricted to the embodiment shown in FIG. 2. After reading this description, those skilled in the art can generate, based on netlist and according to needs, the directed graph in different formats, e.g. a tree graph, as long as the graph can illustrate the directional signal association among components.

In parallel and independently with the analysis of netlist and the generation of directed graph, the chip design is simulated based on the netlist using simulation tools. Unlike the traditional simulation results, only the signals related with sequential logic devices and IO devices are maintained, while the input and output signals of combinational logic devices are ignored. Specifically, in one embodiment, by referring to the above-mentioned device lib, or referring to the constructed sequential logic device list, combinational logic device list and IO device list, the large simulation result files outputted by the simulation tools are modified, wherein the simulation results about combinational logic devices are removed, so as to form the tailored result files. In another embodiment, the simulation tools are set or configured to only record the signals of sequential logic devices and IO devices during the simulation process, so as to directly generate the tailored result files.

Specifically, at step 12, the above tailored result files, which contain the input and output signals of sequential logic devices and IO devices in the simulation results, are obtained. As a part of the simulation results, the signals usually include a lot of X signals.

After obtaining the directed graph generated at step 11 and the simulation signals obtained at step 12, the X signals can be tracked and their root can be finally determined based on such information. That's, at step 13, at least a part of the plurality of X signals can be back traced along the directed graph to determine the device which firstly generates an X signal.

Specifically, the back tracing process can be implemented as follows. For a part or all of the obtained X signals, the related devices are determined. A device which outputs X signals can be called as X device. Then, each X device is set as the current device respectively, and back tracing is performed from the current device along the directed graph to find the previous device connected to the current device. By referring to the simulation results, it is judged whether the output of the previous device is an X signal. If the output of the previous device is not an X signal, that's, the previous device is not an X device, then the current device is determined as the device which firstly generates an X signal. If the previous device is also an X device, the previous device is set as the current device, and the back tracing continues along the directed graph until the output of the previous device is not an X signal or it arrives at IO devices on the edge of the directed graph. It is understood that the existing back tracing method in the directed graph can be used to achieve the above back tracing process.

The device which firstly generates an X signal may be an IO device or a sequential logic device, which is called IO uncertainty or sequential logic device uncertainty respectively.

IO uncertainty denotes X signals caused by IO. The typical instances of IO uncertainty are that the back tracing along the directed graph ends at an IO device, or the input of certain sequential logic device directly connected to an IO device in the directed graph is an X signal. When performing back tracing along the directed graph, once the instances of IO uncertainty happens, it can be determined that the X signals in the simulation results are surely caused by the uncertain signals received by IO devices from outside.

Sequential logic device uncertainty means X signals are caused by improper setting of sequential logic devices. In the case of sequential logic device uncertainty, in the directed graph, the output of a sequential logic device is an X signal while the input is not, in other words, the device is an X device while its previous device is not. This means that the X signals start from the output of the sequential logic device, so the sequential logic device is the root cause of the subsequent X signals.

More specifically, the reasons for sequential logic device uncertainty are mainly as follows. One reason is multi-driven, that's, multiple signal wires are connected to the same port of a sequential logic device. In this case, the sequential logic device can't decide which signal wire should be taken as basis for generating the output, and therefore an X signal is generated. This reason can be confirmed by checking the connecting wires of the sequential logic device in the chip circuit. Another reason is timing problem, that's, the data input and the clock input of the sequential logic device fail to maintain the proper relation. Generally, in order to generate a certain output, the sequential logic device should keep its data input stable for a period before and after the rising edge of the clock comes. Otherwise, if the data input changes in the period, the sequential logic device will generate an uncertain output signal. This reason can be confirmed by checking the relation between the data input and the clock input. The reasons for sequential logic device uncertainty also include clock domain problem, that's, when a data signal is transferred from one clock to another, the uncertainty is caused by the improper clock-pulse overlapping. This reason can be confirmed by checking the overlapping between two different clock pulses.

Therefore, by back tracing X signals along the directed graph and finding the device which firstly generates an X signal, the root of X signals can be determined.

In some chip design, besides combinational logic devices, sequential logic devices and IO devices, there may include other kind of devices, that's, memory devices, which are configured to record and store the signals and the data involved in the circuit. In this case, when analyzing the netlist and generating the directed graph, it also needs to extract the information about memory devices, and include such memory devices in the directed graph. In one example of the directed graph, memory devices are illustrated as the nodes different from those for sequential logic devices, and the signal association among memory devices and other devices is illustrated using the directional connection between these nodes.

Accordingly in one embodiment, in parallel with step 12, the access history related to memory devices, that's the reading and writing operation history on memory devices, is recorded during the simulation process.

In connection with the recorded access history of memory devices, when back tracing X signals along the directed graph which further contains memory devices, memory device uncertainty and its reason, if any, can be determined.

Memory device uncertainty means that X signals are caused by improper configuration of memory devices. The feature of memory device uncertainty is that the readout signal from a memory device is an X signal. When performing back trace along the directed graph, once the feature of memory device uncertainty occurs, it can be determined that the root of X signals in the simulation results is improper configuration of memory devices. This situation is mainly due to improper initialization of memory devices, for example, reading out from a certain address of a memory device before the address gets data written, or improper setting for address pointer, etc. The reason can be verified by checking the access history of memory devices.

Usually, there are a lot of X signals in the simulation results, and all of the X signals can be traced one by one to determine their root. In order to accelerate the tracing process, in one embodiment, a part of X signals can be selected to trace from those X signals in the simulation results.

Moreover, when performing back trace along the directed graph, in one embodiment, the back tracing process can be executed by stages.

In the chip design and simulation, sometimes X signals are allowed for some units or devices, or it needs to ignore some X signals temporarily. In these cases, a configuration file can be set to list the units and devices in which X signals are allowed.

Figure 3:
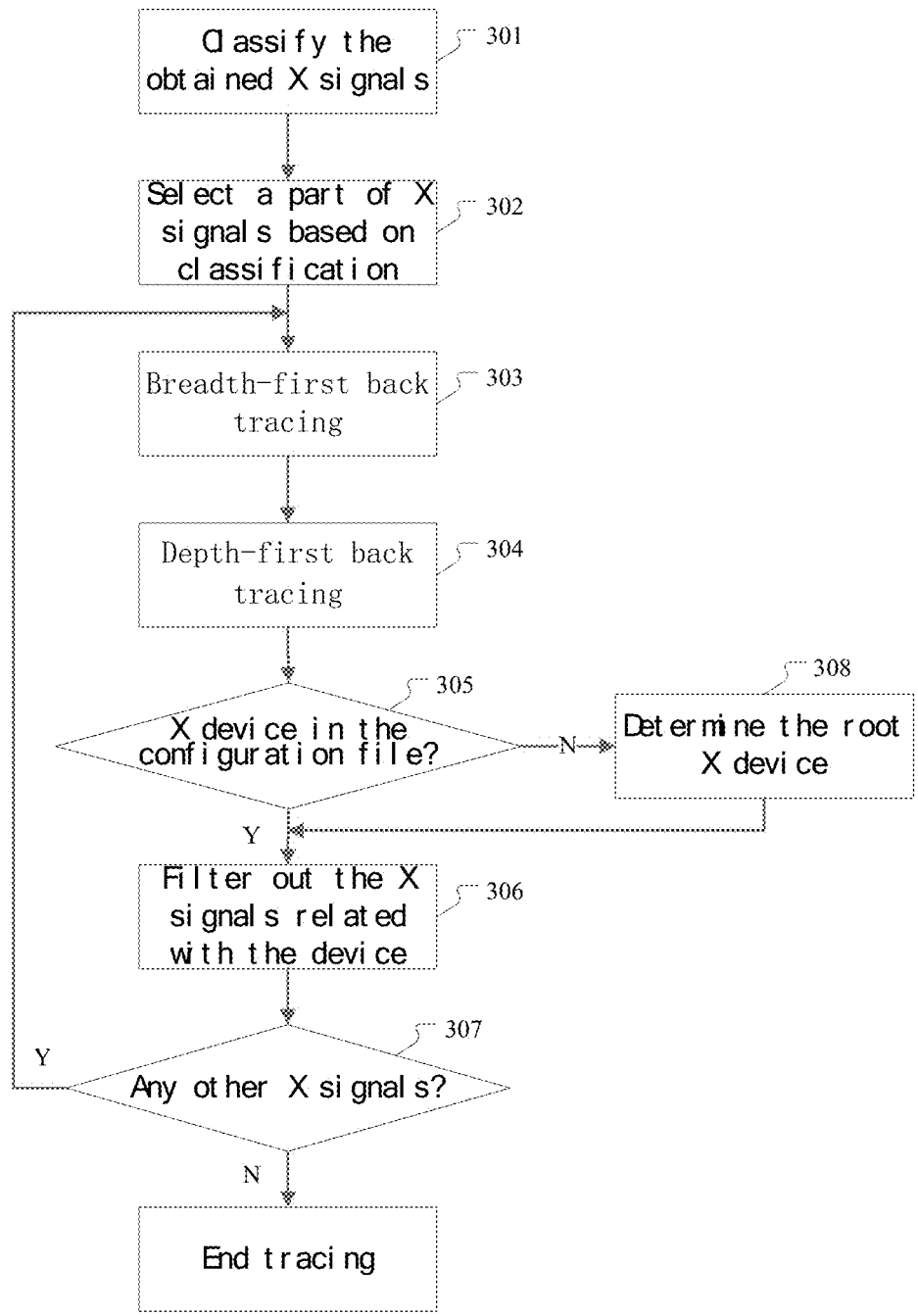
FIG. 3 is a flowchart of the steps for tracing X signals in a directed graph according to one embodiment of the invention.

FIG. 3 is a flowchart of the steps for back tracing X signals in a directed graph according to one embodiment of the invention, that's, the sub-step of step 13 in FIG. 1. In the embodiment shown in FIG. 3, the obtained X signals from the simulation results are firstly classified at step 301; then at step 302 a part of X signals can be selected based on the classification. The signal classification can be based on signals' attributes, such as the name, the vector, the hierarchy, etc. For example, the signal name can indicate the source of the signal. The signals with similar sources, e.g. signals from the same bus, can compose a vector. Besides, hierarchical structure is commonly adopted in the chip design, by which the related hierarchy of a signal can be checked. It is understood that those skilled in the art can use other attributes to classify signals. Based on the classification, a part of typical X signals can be selected for further tracing. For instance, for a plurality of X signals from the same bus, selecting one of them is enough for tracing. Thereby, the number of the X signals to be traced is greatly reduced, and the back tracing process is simplified and also more pertinent.

Then the selected X signals are back traced. Specifically, breadth-first tracing is firstly executed at step 303. At this step, X devices related to these selected X signals are located, and then from each X device, back trace is performed for pre-set steps, e.g. 3 nodes forward, along the directed graph. A counter is set for each X device during the tracing. Once an X device experiences the back tracing, its counter adds 1. Therefore, the counter of an X device indicates the times the device experiences the back tracing. For example, in the directed graph shown in FIG. 2, supposed node 1, node 2, and node 3 are all X devices, then the back tracing processes starting from each X device and going forward 3 nodes make the counters of node 1, node 2 and node 3 to be 3, 1, 1 respectively, since the back tracing from node 2 and node 3 all pass node 1.

Then depth-first back tracing is executed at step 304. In this step, the X device with the largest counter value is selected from the X devices in the directed graph, and the back tracing starts from the X device until meeting the device which firstly generates an X signal.

At step 305, it is judged whether the device firstly generating an X signal is included in the configuration file. If it is included, the X signals related with this device are filtered out at step 306, and then at step 307, it is judged whether there are other X signals in the simulation results.

If the device firstly generating an X signal is not included in the configuration file, then at step 308, according to the device feature and/or referring to the access history of memory devices, the root of the X signal is determined as IO uncertainty, sequential logic device uncertainty, or memory device uncertainty. In one embodiment, for sequential logic device uncertainty, more specific reason is further determined, for example, multi-driven, timing problem or clock domain problem. Then the process goes back to step 306 in which the analyzed and traced X signals are filtered out, and advances to step 307 to judge whether there are other X signals.

If there is no other X signals, the back tracing process ends; if there are also other X signals, then the circuit may have other sources causing X signals, and in this case, the process returns to step 303 to perform back trace again on the rest of signals so as to determine other roots.

Through the above process, the numerous X signals in the simulation results can be tracked automatically and rapidly to determine their root.

It is understood that, although FIG. 3 illustrates the detailed steps and flow of back tracing X signals along the directed graph, the back tracing process is not restricted to FIG. 3, but can be implemented in various manners by those skilled in the art based on this description, for example, selectively omitting the classifying and/or the selecting step, or adopting different classification rules, using different tracing stages, etc., to execute step 103 of FIG. 1 in different manners.

After the back tracing process, the embodiments of this invention can optionally comprise the step of outputting the tracing results. It is understood the tracing results can be outputted in various forms, for example, directly illustrating the devices which cause X signals, illustrating the generation process of X signals, etc. In one embodiment, the waveform files related with each device in the directed graph are also outputted.

Generally speaking, with the method of the embodiments shown in FIG. 1, the information about combinational logic devices can be ignored, which greatly reduces the X signals to be traced and the devices to be checked. Using the directed graph, the signal association among devices is illustrated more directly, so the tracing of X signals can be done straight in the directed graph. Besides, since the embodiment in FIG. 1 only records the signals related with sequential logic devices and IO devices, the waveform files stored by the simulation tools can be decreased obviously, which is convenient for the future operation.

Based on the same conception, this invention also provides the apparatus for tracking X signals.

Figure 4:
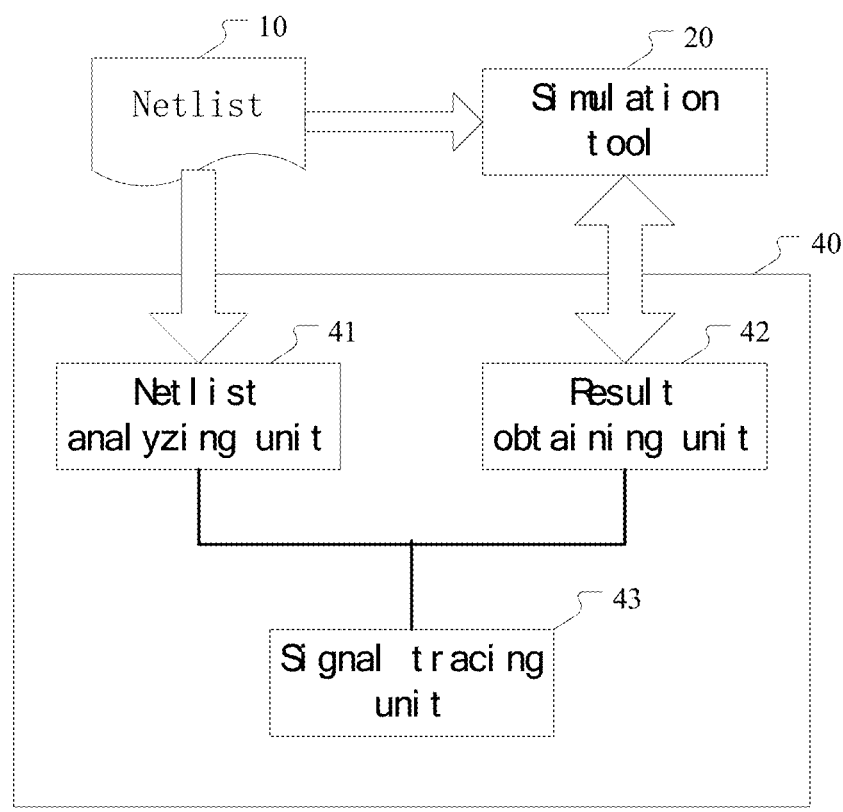
FIG. 4 is a block diagram of the apparatus for tracking X signals according to one embodiment of the invention.

FIG. 4 is a block diagram of the apparatus for tracking X signals according to one embodiment of the invention, the apparatus being based on the general architecture of the existing simulation tools. As shown in the figure, in the existing architecture, simulation tool 20 acquires the data of netlist 10, performs simulation based on netlist 10, and outputs the simulation results. Based on the above, apparatus 40 of one embodiment of the invention for tracking X signals comprises: a netlist analyzing unit 41, configured to generate a directed graph which contains sequential logic devices and IO devices from the netlist in order to illustrate the signal association among devices; a result obtaining unit 42, configured to obtain the signals related with the sequential logic devices and IO devices from the simulation results, wherein the signals contain a plurality of X signals; and a signal tracing unit 43, configured to back trace at least a part of the plurality of X signals along the directed graph to determine the device which firstly generates an X signal.

Specifically, the netlist analyzing unit 41 reads and analyzes the data from netlist 10. Since combinational logic devices don't generate X signals generally, the netlist analyzing unit 41 only focuses on the information about sequential logic devices and IO devices in the netlist, while ignoring the information about combinational logic devices. In detail, the netlist analyzing unit 41 distinguishes sequential logic devices and combinational logic devices by referring to the device lib, the device list or the device structure, and generates the directed graph which contains sequential logic devices and IO devices based on the netlist in order to illustrate the signal association among sequential logic devices and IO devices in the circuit.

Specifically, in one embodiment, taking sequential logic devices and IO devices as nodes and connecting the nodes along the direction of the output signal of each device, the netlist analyzing unit 41 generates the above directed graph. In a specific example, the netlist analyzing unit 41 takes sequential logic devices as one kind of nodes and IO devices as another kind of nodes, so as to illustrate the devices of different type more directly and visually when generating the directed graph. Specific instance of the directed graph is shown in FIG. 2, which is needless to describe. Further, the netlist analyzing unit 41 sends the generated directed graph to the signal tracing unit 43.

On the other hand, the result obtaining unit 42 obtains the simulation results related with sequential logic devices and IO devices from the simulation tool 20.

In the existing simulation tool 20, there are usually some interfaces to interact with users. With these interfaces, simulation tools can be set, configured, or modified to performs simulation and output the results according to users' customization. Accordingly, in one embodiment, the result obtaining unit 42 interacts with the simulation tool 20, and configures it to only record the signals related with sequential logic devices and IO devices while ignoring the input and output signals of combinational logic devices.

Alternatively, in another embodiment, the result obtaining unit 42 just connects to the simulation tool 20 and reads the simulation results from it. However, by referring to the above-mentioned device lib, or referring to the constructed sequential logic device list, combinational logic device list and IO device list, the result obtaining unit 42 can modify the large simulation result files from the simulation tool 20, remove those results related with combinational logic devices and generate tailored results in which only the signals of sequential logic devices and IO devices are maintained.

With the above approach, after simulation tools perform simulation based on the netlist, the result obtaining unit 42 obtains the input and output signals of sequential logic devices and IO devices from the simulation results. As a part of the simulation results, there are usually a lot of X signals. The result obtaining unit 42 further sends the obtained signals to the signal tracing unit 43.

Thus, the signal tracing unit 43 gets the directed graph from the netlist analyzing unit 41 and the simulation results from the result obtaining unit 42, according to which the X signals can be tracked to determine their roots. Specifically, the signal tracing unit 43 back traces at least a part of the plurality of X signals along the directed graph to determine the device which firstly generates an X signal. The back tracing process can be executed as follows. For a part or all of the obtained X signals, the related X devices are determined. Then, each X device is set as the current device respectively, and back trace is performed from the current device along the directed graph to find the previous device connected to the current device. By referring to the simulation results, it is judged whether the output of the previous device is an X signal. If the previous device is not an X device, then the current device is determined as the device which firstly generates an X signal. If the previous device is also an X device, the previous device is set as the current device, and the back tracing continues along the directed graph until the output of the previous device is not an X signal or it arrives at IO devices on the edge of the directed graph.

The device which firstly generates an X signal may be an IO device or a sequential logic device, which can be called IO uncertainty and sequential logic device uncertainty respectively. More particularly, the reasons for sequential logic device uncertainty include multi-driven, timing problem, clock domain problem, etc.

In some chip design, there further include memory devices to record and store the signals and data involved in the circuit. In this case, when analyzing the netlist, the netlist analyzing unit 41 also extracts the information about memory devices and includes memory devices in the directed graph.

Correspondingly, in one embodiment, the result obtaining unit 42 configures the simulation tool 20 to record the access history related with memory devices in the simulation, that's, the reading and writing operation history on memory devices. Also, the result obtaining unit 42 further sends the obtained access history to the signal tracing unit 43.

In connection with the recorded access history to memory devices, when tracing the X signals along the directed graph which contains memory devices, the signal tracing unit 43 can determine memory device uncertainty and its reason.

In one embodiment, to accelerate the back tracing process, the signal tracing unit 43 is configured to select a part of the X signals to trace from numerous X signals in the simulation results. In one embodiment, in order to select the representative X signals, the signal tracing unit 43 is further configured to firstly classify the obtained X signals according to the information like the name, the vector, the hierarchy, etc., and then select a part of X signals to trace based on the above classification.

Furthermore, when tracing along the directed graph, in one embodiment, the signal tracing unit 43 can perform back tracing by stages, for example, breadth-first back tracing first and depth-first back tracing second, to find the device which firstly generates an X signal.

In the chip design and simulation, sometimes some units or devices are allowed to generate X signals, or it needs to ignore some X signals temperately. Accordingly, the apparatus 40 can also comprise a configuration file setting unit (not shown), which receives users' setting as an interface and forms a configuration file which lists the units and devices in which X signals are allowed. Correspondingly, the signal tracing unit 43 will refer to the configuration file when tracing the signals to judge whether an X device is excluded in the configuration file.

Thereby, with the above apparatus, X signals can be automatically traced and the root of X signals can be determined. The instances for detail operation of each unit are as described in connection with the method, which is needless to describe again.

Through the above description of the embodiments, those skilled in the art will recognize that the above-mentioned method and apparatus for tracking X signals can be practiced by executable instructions and/or controlling codes in the processors e.g. codes in mediums like disc, CD or DVD-ROM; memories like ROM or EPROM; and carriers like optical or electronic signal carrier. The apparatus and its units can be realized using hardware like VLSI or Gates and Arrays, like semiconductors e.g. Logic Chip, transistors, etc., or like programmable hardware devices e.g. FPGA, programmable logic equipments, etc.; or using software executed by different kinds of processors; or using the integration of the hardware and software. The software and program codes for implementing the invention can be programmed using one program language or the combination of a plurality of program languages, including but not limited to, object-oriented languages like Java, Smalltalk, C++, etc., and the traditional procedural languages like C language or other similar languages. The source codes can be executed locally or remotely to realize defined operation.

The above-described exemplary embodiments are intended to be illustrative in all respects of the method and apparatus for tracing X signals, rather than restrictive, of the present invention. Those skilled in the art should recognize that the present invention is capable of many variations and modifications within the scope and spirit of the present invention. The scope of the present invention is defined only by the appended claims.

The invention claimed is:

1. A method for tracking uncertain signals in a simulation of a chip design, comprising:
    generating a directed graph which contains sequential logic devices and input/output (IO) devices from a netlist of the chip design, wherein the directed graph illustrates a signal association among the sequential logic devices and IO devices, the sequential logic device being devices wherein the output of the devices are dependent on the current input to the devices and the previous state of the devices;
    obtaining signals related to the sequential logic devices and IO devices from simulation results, wherein the signals contain a plurality of uncertain signals; and
    back tracing, using a processor, at least a part of the plurality of uncertain signals along the directed graph to determine the device which firstly generates an uncertain signal.

2. The method of claim 1, wherein the step of generating a directed graph which contains sequential logic devices and IO devices comprises:
    distinguishing sequential logic devices, combinational logic devices and IO devices through at least one of the following:
    creating a sequential logic device list, a combinational logic device list and IO device list;
    referring to the device library; and
    referring to device connectivity in the netlist.

3. The method of claim 1, wherein in the directed graph, the sequential logic devices and the IO devices are illustrated as nodes of different types.

4. The method of claim 1, wherein the step of back tracing at least a part of the plurality of uncertain signals comprises:
classifying the plurality of uncertain signals; and
selecting a part of uncertain signals to back trace from the plurality of uncertain signals according to the classification results.

5. The method of claim 1, wherein the step of back tracing at least a part of the plurality of uncertain signals comprises:
locating uncertain devices related to the at least a part of uncertain signals;
performing back tracing for pre-set steps from each uncertain device along the directed graph; and
setting a counter for each uncertain device, the counter value reflecting the number of times the uncertain device experiences the back tracing.

6. The method of claim 5, wherein the step of back tracing at least a part of the plurality of uncertain signals further comprises:
performing back tracing from the uncertain device with a largest counter value until meeting the device which firstly generates an uncertain signal.

7. The method of claim 1, further comprising:
reading a configuration file which contains a list of devices that are allowed to generate uncertain signals, judging whether the determined device which firstly generates an uncertain signal is contained in the configuration file, and excluding the device which firstly generates an uncertain signal if it is contained in the configuration file.

8. The method of claim 1, wherein the netlist further includes memory devices and the method further comprises:
extracting information about memory devices from the netlist and making the directed graph include the information about memory devices.

9. The method of claim 8, further comprising:
recording the access history of the memory devices; and
determining the reason for the uncertain signal by referring to an access history when the device which firstly generates an uncertain signal is a memory device.

10. An apparatus for tracking uncertain signals in a simulation of a chip design, comprising:
a netlist analyzing unit, configured to generate a directed graph which contains sequential logic devices and input/output (IO) devices from the netlist of the chip design, wherein the directed graph illustrates a signal association among the sequential logic devices and IO devices, the sequential logic device being devices wherein the output of the devices are dependent on the current input to the devices and the previous state of the devices;
a result obtaining unit, configured to obtain the signals related to the sequential logic devices and IO devices from simulation results, wherein the signals contain a plurality of uncertain signals; and
a signal tracing unit, configured to back trace at least a part of the plurality of uncertain signals along the directed graph to determine the device which firstly generates an uncertain signal.

11. The apparatus of claim 10, wherein the netlist analyzing unit is configured to distinguish sequential logic devices, combinational logic devices and IO devices through at least one of the following:
creating a sequential logic device list, a combinational logic device list and an IO device list;
referring to the device library; and
referring to the device connectivity in the netlist.

12. The apparatus of claim 11, wherein the netlist further includes memory devices, the netlist analyzing unit is further configured to extract information about memory devices from the netlist and make the directed graph include the information about memory devices.

13. The apparatus of claim 10, wherein in the directed graph, the sequential logic devices and the IO devices are illustrated as nodes of different types.

14. The apparatus of claim 13, wherein the netlist further includes memory devices, the netlist analyzing unit is further configured to extract information about memory devices from the netlist and make the directed graph include the information about memory devices.

15. The apparatus of claim 10, wherein the signal tracing unit is further configured to classify the plurality of uncertain signals, and select a part of uncertain signals to back trace from the plurality of uncertain signals according to the classification results.

16. The apparatus of claim 10, wherein the signal tracing unit is configured to locate uncertain devices related to the at least a part of uncertain signals, perform back tracing for pre-set steps from each uncertain device along the directed graph, and set a counter for each uncertain device, the counter value reflecting the times the uncertain device experiences the back tracing.

17. The apparatus of claim 16, wherein the signal tracing unit is further configured to perform back tracing from the uncertain device with a largest counter value until meeting the device which firstly generates an uncertain signal.

18. The apparatus of claim 10, further comprising;
a configuration file setting unit, configured to receive a configuration file which contains a list of devices that are allowed to generate uncertain signals; and
wherein the signal tracing unit is further configured to judge whether the determined device which firstly generates an uncertain signal is contained in the configuration file, and exclude the device which firstly generates an uncertain signal if it is contained in the configuration file.

19. The apparatus of claim 10, wherein the netlist further includes memory devices, the netlist analyzing unit is further configured to extract information about memory devices from the netlist and make the directed graph include the information about memory devices.

20. The apparatus of claim 19, wherein the result obtaining unit is further configured to record an access history of the memory devices, the signal tracing unit is further configured to determine a reason for the uncertain signal by referring to the access history when the device which firstly generates an uncertain signal is a memory device.

* * * * *